United States Patent [19]

Saul et al.

[11] 4,243,949
[45] Jan. 6, 1981

[54] FREQUENCY STABILIZATION TECHNIQUE FOR MICROSTRIP OSCILLATORS

[75] Inventors: David L. Saul, El Cajon; David Rubin, San Diego, both of Calif.

[73] Assignee: The United States of America as represented by the Secretary of the Navy, Washington, D.C.

[21] Appl. No.: 961,580

[22] Filed: Nov. 17, 1978

[51] Int. Cl.³ .............................................. H03L 7/04
[52] U.S. Cl. ........................................ 331/9; 331/176
[58] Field of Search ................. 331/9, 1 R, 36 C, 176, 331/177 V

[56] References Cited

U.S. PATENT DOCUMENTS 2,502,456  4/1950  Hansen et al. .................. 331/9 X

OTHER PUBLICATIONS

IEE Standard Dictionary of Electrical and Electronics Terms, pp. 152-153, 1972, Wiley-interscience.
B. Glance et al., "A discriminator microstrip oscillator", IEEE Transactions on Microwave Theory and Techniques, vol. MTT-24, No. 10, pp. 648-650, Oct. 1976.

*Primary Examiner*—Siegfried H. Grimm
*Assistant Examiner*—Edward P. Westin
*Attorney, Agent, or Firm*—Richard S. Sciascia; Ervin F. Johnston; Harvey Fendelman

[57] ABSTRACT

An apparatus for frequency stabilizing a microstrip oscillator using an integrated diplexer as a frequency discriminator. The crossover frequency of the microstrip diplexer is used in a feedback arrangement to stabilize a millimeter-wave oscillator. The diplexer is coupled to the output of the oscillator and detects a shift from the desired oscillator output frequency. This shift in frequency is converted to a voltage for controlling the varactor tuning element of the oscillator to thereby return the oscillator to the desired operating frequency. Means are also provided for sensing a temperature change in the diplexer and for insuring that the oscillator output frequency is maintained at the desired frequency regardless of this temperature change.

5 Claims, 3 Drawing Figures

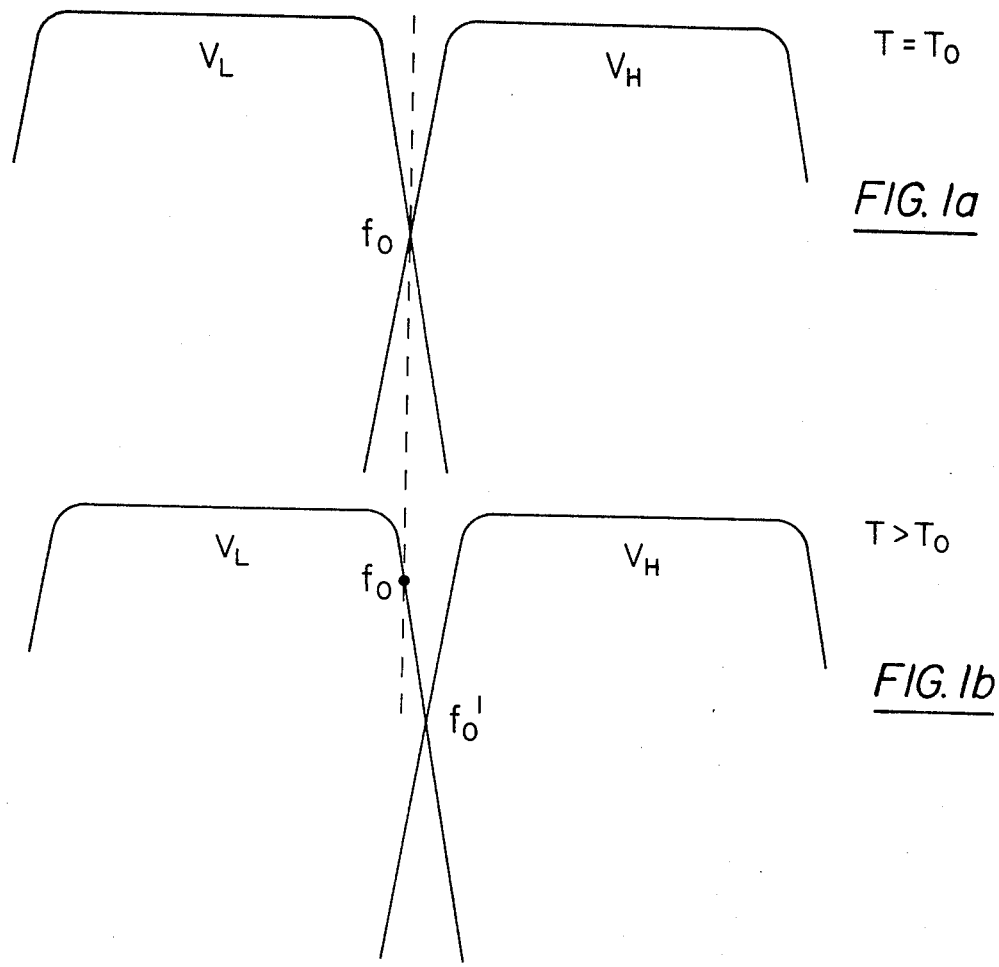
FIG. 1a
FIG. 1b
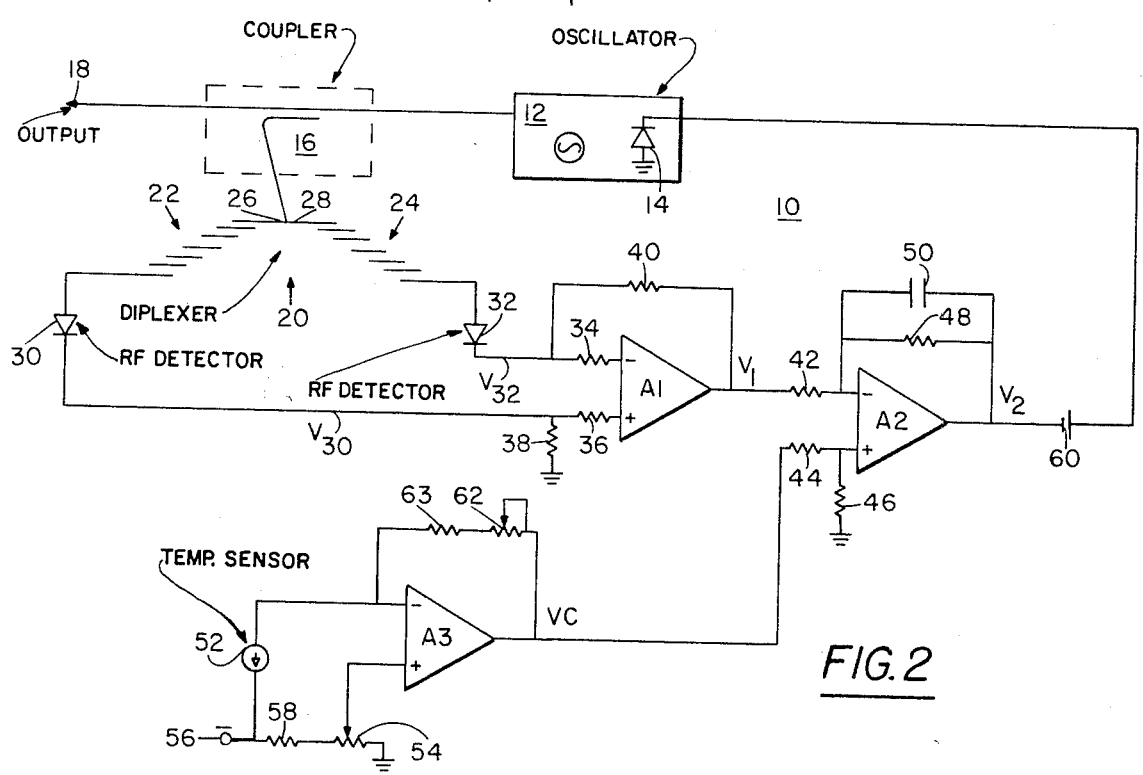
FIG. 2

FREQUENCY STABILIZATION TECHNIQUE FOR MICROSTRIP OSCILLATORS

BACKGROUND OF THE INVENTION

The present invention relates generally to the field of frequency stabilization of oscillators and more particularly to stabilization of microstrip oscillators using microwave integrated circuit components. Because of the low Q associated with microstrip resonators, MIC oscillators generally are much less stable than their waveguide counterparts. At microwave frequencies passive ceramic resonators have been used as well as active orthogonal microstrip resonators for frequency stabilization. Neither of these techniques has been shown to be effective at millimeter-wave frequencies.

SUMMARY OF THE INVENTION

The present invention relates to microwave and millimeter wave components used for stabilizing a microstrip oscillator. The sharp fall-off at the band edges of coupled microstrip filters can be thought of as due to the combined effects of several resonant circuits in series. This band edge fall-off is far greater than that obtainable from any single MIC resonator. In accordance with the present invention, two band-pass MIC filters formed as a diplexer are arranged so that the crossover frequency is quite precise. Detectors placed at the output terminals of the diplexer are used to determine whether the oscillator frequency is above or below the crossover frequency. With the aid of operational amplifiers connected in a feedback arrangement with the oscillator's varactor frequency control, the oscillator is made to run precisely at the crossover frequency. Since the dielectric constant of the diplexer's substrate may change with temperature change, the crossover frequency and hence the oscillator frequency will also change with temperature variation. To correct for this, a temperature sensor in thermal proximity with the diplexer is used in the feedback loop. The frequency of oscillation therefore can be temperature compensated by forcing it to be at one side or the other of the diplexer crossover frequency by the necessary amount.

OBJECTS OF THE INVENTION

It is the primary object of the present invention to disclose a center frequency stabilization technique for microwave oscillators.

It is a concomitant object of the present invention to disclose a technique for reducing the FM noise factor in a microwave oscillator while controlling the center frequency of the oscillator.

It is an additional object of the present invention to disclose a technique and means for precisely varying the center frequency of a millimeter wave oscillator.

It is an additional object of the present invention to disclose a technique and means for correcting changes in the center frequency of a millimeter wave oscillator caused by temperature changes.

Other objects, advantages and novel features of the invention will become apparent from the following detailed description of the invention when considered in conjunction with the accompanying drawings.

BRIEF DESCRIPTION OF THE DRAWINGS

FIG. 1a is a graphical representation of the crossover frequency of the diplexer used in the present invention.

FIG. 1b is a graphical representation of the change in diplexer crossover frequency with temperature.

FIG. 2 is a schematic network diagram of the frequency stabilization network of the present invention.

DESCRIPTION OF THE PREFERRED EMBODIMENT

Referring to FIG. 2 there is illustrated a schematic network diagram of the oscillator stabilizer 10 of the present invention. The oscillator 12 for which frequency stabilization is provided includes a varactor tuning element 14 and may be a Gunn oscillator or any other suitable varactor tuned microwave or millimeter wave oscillator. The output power of the oscillator 12 is sensed by coupler 16 which may be any suitable microwave coupler such as, for example, a quadrature coupler. The coupler 16 functions to permit most of the oscillator output signal power to be transmitted to output 18 and further functions to couple a portion of the oscillator output to the diplexer 20. The coupled power may be, for instance, 10 dB less than the output power at 18.

Diplexer 20 is described in detail in U.S. Pat. No. 4,168,479 filed on Oct. 24, 1977 and issued on Sept. 18, 1979 to by David Rubin. The full text of that application is hereby incorporated by reference in its entirety to this application. Briefly, the diplexer 20 is comprised of two separate parallel coupled filters 22 and 24. These filters are almost totally reactive outside their bandwidths. Transmission lines 26 and 28 at the front of each band-pass filter section are provided such that each filter 22 and 24 is made to appear as an open circuit at the center frequency of the other.

The outputs of the band-pass filters 22 and 24 are detected by RF detectors 30 and 32 which preferably comprise beam lead Schottky barrier detector diodes. Operational amplifier A1 amplifies the difference between the detected output voltages from the diplexer 20 as detected by detectors 30 and 32. Resistive dividers 34, 36 and 38 are provided and resistor 40, used for controlling gain, is connected as illustrated in a well-known manner.

A second operational amplifier A2 has its inverting input connected to the output of amplifier A1 through load resistor 42, and has its non-inverting input connected to the output of operational amplifier A3 through the voltage dividing resistors 44 and 46. Gain control resistor 48 and noise reduction, integrating capacitor 50 are connected in a feedback arrangement as is illustrated. The inverting input of operational amplifier A3 has connected to it the temperature sensor 52 and has its non-inverting input connected to temperature offset potentiometer 54. A negative voltage supply 56 is connected to the temperature sensor 52 and also to resistor 58. Temperature sensor 52 comprises a heat-to-current transducer. Such a device suitable for use in the present invention is manufactured by Analog Devices, part No. AD590JH. The temperature sensor 52 is placed adjacent or on the dielectric substrate of the diplexer 20 and produces a current proportional to the absolute sensed temperature of that substrate.

The remaining element of the network 10 is the battery 60 which is provided for back biasing the varactor 14. Battery 60 may be eliminated by back biasing the varactor 14 at the oscillator 12.

Referring now to FIGS. 1a and 1b, there is shown in FIG. 1a the ideal frequency response curve for the diplexer 20. $V_L$ represents the pass-band of the lower frequency pass-band filter 24 and $V_H$ represents the pass-band of the upper frequency pass-band filter 22. The crossover point $f_o$ is several dB down from the highest output where the band-pass skirts are very sharp. FIG. 1b illustrates an exemplary shift of the diplexer crossover frequency to $f'_o$ caused by a variation in the temperature, T, of the diplexer 20. In FIG. 1a, $T=T_o$, room temperature. In FIG. 1b, $T>T_o$.

Assuming that the oscillator 12 is operating at the diplexer crossover frequency, the signals detected by detectors 30 and 32 will be equal and the voltage V1 will be zero as will the output of amplifier A2. Should the oscillator frequency vary from the diplexer crossover point, detectors 30 and 32 will sense unequal signals. Amplifier A1 amplifies the difference between the outputs of the detectors 30 and 32. The amplified difference voltage V1 is then compared to the temperature control voltage VC and applied after further amplification by amplifier A2 to the varactor tuning element 14. This output voltage is in the correct phase to bring the oscillator back to the crossover frequency $f_o$. If the voltage VC were set equal to zero and the oscillator 12 frequency instantaneously went high, V1 would also go high and voltage V2 would go low, decreasing the varactor 14 back bias and decreasing the oscillator 12 operating frequency. An instantaneous low frequency from the oscillator 12 would result in an increase in voltage V2 resulting in an increased back bias on varactor 14 and a concomitant increase in the frequency of the oscillator 12.

If voltage VC is set at some value not equal to zero by adjusting potentiometer 54, the oscillator 12 frequency will change so that $V1 \simeq VC$, i.e., the oscillator 12 will change frequency so that one of the detectors 30 and 32 produces more output voltage than the other. The required voltage function VC (T) can be found by changing the ambient temperature of the diplexer and experimentally changing the voltage VC so that the oscillator 12 frequency remains constant.

The function VC (T) is generally linear over the usual temperature ranges of the diplexer 20 and can be generated in many ways. The temperature sensor 52 produces a current proportional to the absolute temperature. Amplifier A3 has an offset adjusted by potentiometer 54 so that at room temperature ($T_o$) the voltage VC=0 and at other temperatures $VC=k(T_o-T)$. The value k is set by the gain control 62. Assuming that the temperature of the diplexer 20 is above $T_o$, referring to FIG. 1 it is seen that if the oscillator frequency is to stay at $f_o$, the low frequency detector 32 must have more output voltage than the high frequency detector 30. This would force V1 to go negative. A negative voltage VC from the thermal sensor amplifier A3 in effect forces the voltage V1 to go negative hence moving the oscillation frequency away from the temperature dependent crossover frequency $f'_o$, back to the frequency $f_o$. Dielectric constant changes due to cooler temperatures are compensated by a positive voltage VC forcing the voltage V1 to go positive. This is done through the varactor's 14 increasing the frequency of the oscillator 12 so that $V_{30} > V_{32}$. By using this arrangement it has also been experimentally shown that FM noise due to oscillator instability can be decreased by several orders of magnitude.

Obviously many modifications and variations of the present invention are possible in the light of the above teachings. It is therefore to be understood that within the scope of the appended claims the invention may be practiced otherwise than as specifically described.

What is claimed is:

1. A millimeter wave frequency stabilized MIC oscillator network comprising:

an MIC oscillator having an input and an output;

a signal coupler coupled to said output;

a frequency diplexer coupled to said coupler, said diplexer having first and second passbands of frequencies;

first means for detecting the power output of said diplexer in said first passband;

second means for detecting the power output of said diplexer in said second passband;

feedback means connected to said first and second means and to said input for varying the voltage to said input to thereby control the operating frequency of said oscillator, said feedback means further comprising heat-to-current transducer means disposed in thermal proximity to said diplexer for varying the voltage to said input commensurately with variation in the temperature of said diplexer.

2. A millimeter wave frequency stabilized MIC oscillator network comprising:

an MIC oscillator having an input and an output;

a signal coupler coupled to said output;

a frequency diplexer coupled to said coupler, said diplexer having first and second passbands of frequencies;

first means for detecting the power output of said diplexer in said first passband;

second means for detecting the power output of said diplexer in said second passband;

feedback means connected to said first and second means and to said input for varying the voltage to said input to thereby control the operating frequency of said oscillator, said feedback means comprising a heat-to-current transducer disposed in thermal proximity to said diplexer, an amplifier connected to said transducer, a first differential amplifier connected to said first and second means, and a second differential amplifier connected to said first differential amplifier and to said amplifier.

3. The network of claim 2 wherein said first and second means are RF detector diodes.

4. The network of claim 3 wherein said diplexer comprises a first parallel coupled bandpass filter having a center frequency $f_1$; and a second parallel coupled bandpass filter having a center frequency $f_2$ different from $f_1$.

5. The network of claim 3 wherein said coupler couples less than 50% of the output power from said oscillator to said frequency diplexer.

* * * * *